(12) United States Patent
Cheng

(10) Patent No.: US 10,785,354 B2
(45) Date of Patent: Sep. 22, 2020

(54) DISPLAY ASSEMBLY AND MOBILE TERMINAL

(71) Applicant: GUANGDONG OPPO MOBILE TELECOMMUNICATIONS CORP., LTD., Dongguan, Guangdong (CN)

(72) Inventor: Jiao Cheng, Dongguan (CN)

(73) Assignee: GUANGDONG OPPO MOBILE TELECOMMUNCATIONS CORP., LTD, Dongguan, Guangdong (CN)

( * ) Notice: Subject to any disclaimer, the term of this patent is extended or adjusted under 35 U.S.C. 154(b) by 0 days.

(21) Appl. No.: 16/362,161

(22) Filed: Mar. 22, 2019

(65) Prior Publication Data

US 2019/0302527 A1 Oct. 3, 2019

(30) Foreign Application Priority Data

Mar. 30, 2018 (CN) .......................... 2018 1 0296873
Mar. 30, 2018 (CN) ..................... 2018 2 0479623 U

(51) Int. Cl.
H04M 1/02 (2006.01)
H04N 5/225 (2006.01)

(52) U.S. Cl.
CPC ........ *H04M 1/0264* (2013.01); *H04N 5/2257* (2013.01)

(58) Field of Classification Search
CPC .. H04M 1/0264; H04M 1/0202; H04M 1/026; H04N 5/2257; G02F 1/133308; G02F 2001/133314
See application file for complete search history.

(56) References Cited

U.S. PATENT DOCUMENTS

2012/0105400 A1* 5/2012 Mathew ............... H04N 5/2251
345/207
2016/0011633 A1 1/2016 Watanabe et al.
2017/0293180 A1 10/2017 Chinen et al.

FOREIGN PATENT DOCUMENTS

| CN | 104750282 A | 7/2015 |
| CN | 106506742 A | 3/2017 |
| CN | 106850894 A | 6/2017 |
| CN | 106936954 A | 7/2017 |

(Continued)

OTHER PUBLICATIONS

Written Opinion of the International Searching Authority and International Search Report issued in corresponding International application PCT/CN2019/075957, dated Apr. 29, 2019 (11 pages).

(Continued)

*Primary Examiner* — Thanh Nhan P Nguyen
(74) *Attorney, Agent, or Firm* — Ladas & Parry, LLP

(57) ABSTRACT

The embodiments of the disclosure provide a display assembly and a mobile terminal, relate to a technical field of mobile terminal. The display assembly may include a display screen and a positioning member. The display screen may include a bottom face and a display face. The display screen defines a light transmitting hole in the display screen and at least penetrating through the bottom face. The positioning member is positioned on the bottom face and located at a periphery of the light transmitting hole. The positioning member is configured to limit a movement of a functional device received in the light transmitting hole in a direction parallel to the bottom face.

20 Claims, 5 Drawing Sheets

(56) References Cited

FOREIGN PATENT DOCUMENTS

| | | |
|---|---|---|
| CN | 107067971 A | 8/2017 |
| CN | 107071244 A | 8/2017 |
| CN | 206640623 U | 11/2017 |
| CN | 107454232 A | 12/2017 |
| CN | 107483692 A | 12/2017 |
| CN | 108429835 A | 8/2018 |
| CN | 208386601 U | 1/2019 |
| EP | 2448243 A2 | 5/2012 |
| KR | 20170118985 A | 10/2017 |
| WO | 2017171498 A | 10/2017 |

OTHER PUBLICATIONS

European Search Report issued in corresponding European application No. 19157950.7, dated Jul. 4, 2019 (9 pages).
First Notification of an Office Action and Search Report issued in corresponding Chinese application No. 201810296873.X, dated May 7, 2019 (7 pages).
Second Notification of an Office Action issued in corresponding Chinese application No. 201810296873.X, dated Aug. 2, 2019 (9 pages).
Third Notification of an Office Action issued in corresponding Chinese application No. 201810296873.X, dated Oct. 8, 2019 (3 pages).
Notification to grant patent righ for invention and supplementary search report issued in corresponding Chinese application No. CN201810296873,X, dated Jan. 13, 2020 (4 pages).

* cited by examiner

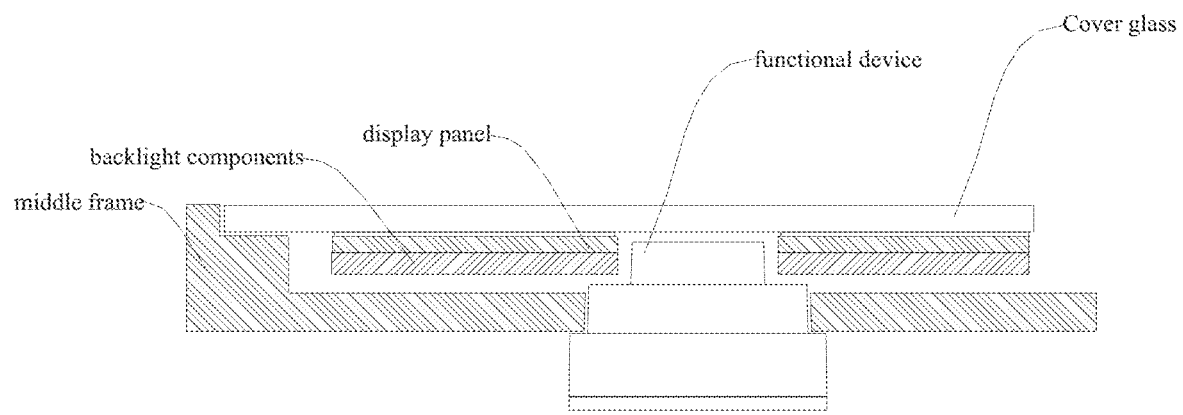
FIG. 1 --Prior Art--
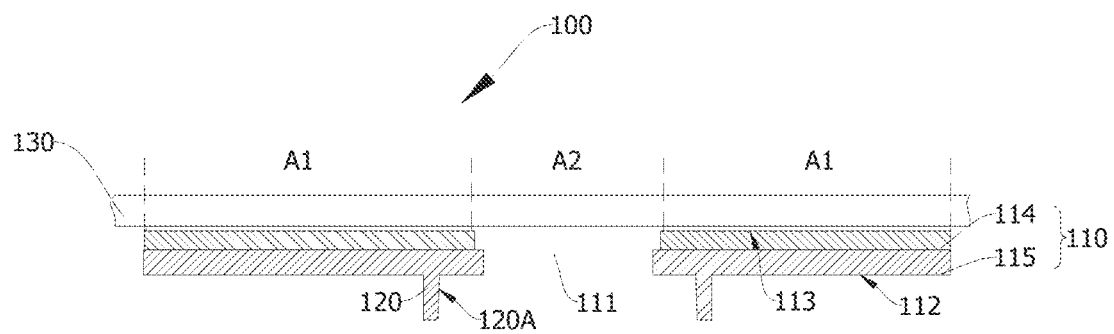
FIG. 2
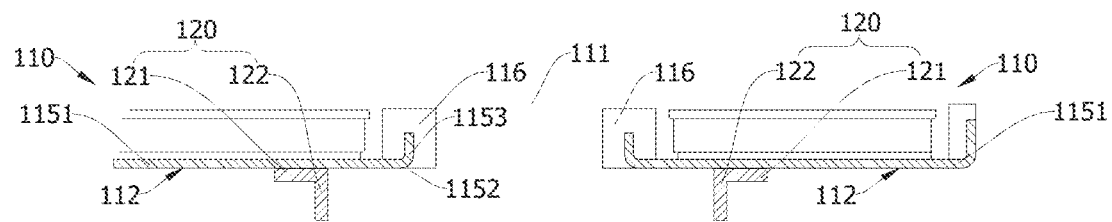
FIG. 3

DISPLAY ASSEMBLY AND MOBILE TERMINAL

CROSS-REFERENCE TO RELATED APPLICATIONS

This application claims priority to a Chinese application No. 201810296873.X filed on Mar. 30, 2018, titled "DISPLAY ASSEMBLY AND MOBILE TERMINAL" and a Chinese application No. 201820479623.5 filed on Mar. 30, 2018, titled "DISPLAY ASSEMBLY AND MOBILE TERMINAL," the entireties of the above-mentioned applications are incorporated herein by reference.

TECHNICAL FIELD

The present disclosure relates to a technical field of mobile terminal, and particularly to a display assembly and a mobile terminal.

BACKGROUND

Mobile terminals, such as mobile phones, have become one kind of the most popular consumer electronic products in people's daily life. At the same time, the user's requirements for the display effect of mobile terminal are increasingly demanding, more mobile terminal manufacturers began to choose to expand the area of the display area in the display screen to increase the proportion of display area, achieve a full-screen effect to enhance the user's visual experience. However, in the case of maximizing the proportion of the display area, components such as front camera set in the direction of display screen will affect the display effect.

SUMMARY

The present disclosure provides a display assembly and a mobile terminal.

In a first aspect, the embodiments of the present disclosure provide a display assembly. The display assembly may include a display screen and a positioning member. The display screen may include a bottom face and a display face. The display screen may define a light transmitting hole in the display screen and at least penetrate through the bottom face. The positioning member is positioned on the bottom face and located at a periphery of the light transmitting hole, and configured to limit a movement of a functional device received in the light transmitting hole in a direction parallel to the bottom face.

In a second aspect, the embodiments of the disclosure further provide a display assembly. The display assembly may include a display screen, a positioning member and a functional device. The display screen may include a bottom face and a display face. The display screen may define a light transmitting hole in the display screen and at least penetrate through the bottom face. The positioning member is positioned on the bottom face and located at a periphery of the light transmitting hole. The functional device is received in the light transmitting hole and positioned by the positioning member.

In a third aspect, the embodiments of the disclosure further provide a mobile terminal. The mobile terminal may include a display screen, a positioning member, a functional device and a housing. The display screen may include a bottom face and a display face. The display screen may define a light transmitting hole in the display screen and at least penetrate through the bottom face. The positioning member is positioned on the bottom face and located at a periphery of the light transmitting hole. The functional device is received in the light transmitting hole and positioned by the positioning member. The display screen, the positioning member and the functional device is disposed in the housing.

BRIEF DESCRIPTION OF THE DRAWINGS

In order to more clearly illustrate the technical solution in the embodiment of the present disclosure, the accompanying drawings to be used in the description of the embodiments will be briefly described below. Obviously, the accompanying drawings in the following description are only some embodiments of the present disclosure, for those skilled in the art, other accompanying drawings can be obtained from these accompanying drawings without creative efforts.

FIG. 1 is a schematic sectional view of a display assembly.

FIG. 2 is a schematic sectional view of a display assembly provided by a first embodiment of the present disclosure.

FIG. 3 is a schematic sectional view of a positioning member provided by the first embodiment of the present disclosure.

DETAILED DESCRIPTION OF PREFERRED EMBODIMENTS

Figure 4:
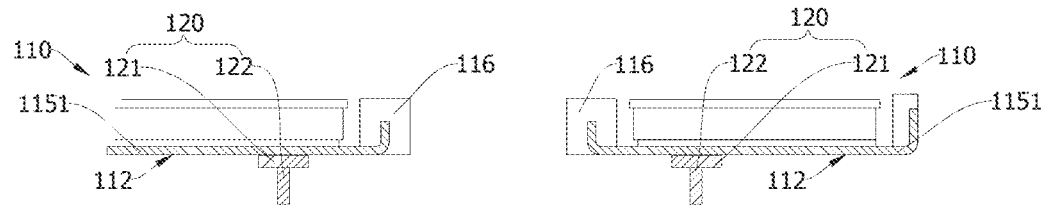
FIG. 4 is a schematic sectional view of another positioning member provided by the first embodiment of the present disclosure.

Hereinafter, the embodiments of the present disclosure will be described in detail. Examples of the embodiments are illustrated in the accompanying drawings. Throughout, the same or similar reference numerals indicate the same or similar elements or elements having the same or similar functions. The embodiments described below with reference to the accompanying drawings are exemplary, are used for explaining the present disclosure only, and should not be construed as limiting the present disclosure.

In the description of the present disclosure, it is to be understood that the terms "center", "longitudinal", "transverse", "length", "width", "thickness", "upper", "lower", "front", "back", "left", "right", "vertical", "horizontal", "top", "bottom", "inner", "outside", "clockwise" and "counterclockwise" indicates an orientation or positional relationship based on the orientation or positional relationship shown in the accompanying drawings. It is merely for convenience of description of the present disclosure and simplification of the description, and does not indicate or imply that the indicated device or element must have a particular orientation, be constructed and operated in a particular orientation, and therefore should not be construed to limit the present disclosure.

Furthermore, terms "first" and "second" are used for descriptive purposes only, and are not to be construed as indicating or implying relative importance or implicitly indicating the number of indicated technical features. Thus, features that are defined as "first", "second" may explicitly or implicitly include one or more of the described features. In the description of the present disclosure, the term of "plurality" means two or more than two, unless specifically defined otherwise.

In the description of the present disclosure, it is to be understood that the terms "install", "connect", "couple" should be broadly understood, unless otherwise specified and defined. For example, a connection may be a fixed connection or a removable connection, or an integrally connection. A connection can be a mechanical connection or an electrical connection or can communicate with each other. A connection also can be a directly connection or an indirectly connection by intermediate medium. A connection can be the internal communication of two elements or the interaction of two elements. The specific meaning of the above-mentioned terms in the present disclosure may be understood by those skilled in the art considering specific circumstances.

In the present disclosure, the "up" or "down" of the first feature in the second feature may include direct contact between the first and second features, or not direct contact but contact by further features between them. Moreover, the first feature "above", "up" and "upside" the second feature includes the first feature directly above and diagonally above the second feature, or simply indicating that the first feature is higher in height than the second feature. The first feature "below", "down" and "under" the second feature includes the first feature directly below and diagonally below the second feature, or merely indicating that the first feature is less horizontal than the second feature.

A display screen is usually used to display text, images, icons, or videos on mobile devices such as mobile phones, tablets, and wearable electronic devices. In order to meet the user's increasingly requirements for the clarity and fineness of the displayed content, more mobile terminals use larger touch display screen for full-screen display. However, it was found that the front camera, the proximity sensor, the earpiece and other functional device set in the display side of mobile terminal would limit the areas that the display screen could extend to.

Generally, the mobile terminal may include a front panel, a rear cover, and a frame. The front panel may include an upper area, a middle screen area, and a lower area. Usually, the upper area is mounted with non-display components such as a sound outlet of the earpiece and a front camera. The middle screen area is provided with a touch display screen, and one to three physical buttons are arranged in the lower area. With the development of technology, the lower area is gradually canceled, and the physical button is replaced by a virtual button in the touch display screen.

The functional elements such as the sound outlet of the earpiece and the front camera provided in the upper area are important for the mobile phone, and are not suitable to cancel. Therefore, it is difficult to extend the display area of the touch display screen to cover the upper area. After a series of studies, the inventors found that a hole can be defined in the display area of the touch display screen, and the functional elements set in the upper area may be collectively set in the hole, so that the upper area can be extend into a partial of the display screen to increase the display area to achieve a full-screen effect. The touch display screen may include a cover panel, a touch sensor, a display screen, and a rear panel. Wherein, the cover panel, the touch sensor, the display screen, and the rear panel are stacked. The hole defined in the display area of the touch display screen extends from the rear panel toward the cover panel.

The functional device may include at least one of the electronic components of a projection component, a camera, a proximity light sensor, an earpiece, a distance sensor, an ambient light level sensor, a temperature sensor, and a pressure sensor.

However, after a long period of research, the inventor found that the functional device (such as the front camera) is limited by the middle frame (as shown in FIG. 1). Due to the dimensional relationship between the camera and the hole of the display screen, the tolerance chain is very long, including the tolerance of the camera itself, the tolerance of the middle frame, the assembly tolerance of the display assembly (including the display panel and the backlight components) and the middle frame, the fit tolerance of the display panel, and the assembly tolerance of the display panel and the backlight components. Therefore, the safety design gap between the front camera and the inner face of the hole needs to reach about 0.4 mm, which causes the diameter of the opening in the display to increase by about 0.8 mm on the basis of the lens diameter. The width of the module (board width) also cannot be further reduced, and the black side is wide and affects the appearance. In FIG. 1, a large gap is left between the camera and the display panel, thereby causing a large opening in the display.

A display assembly and a mobile terminal according to the embodiments of the present disclosure are provided to reduce the size of the hole and increase the proportion of the displayable area of the display screen of the mobile terminal. The embodiments of the present disclosure will be specifically described below with reference to the accompanying drawings.

The First Embodiment

Referring to FIG. 2, FIG. 2 is a schematic cross-sectional view of a display assembly 100 according to the first embodiment of the present disclosure. The display assembly 100 may include a display screen 110 and a positioning member 120. The display screen 110 may define a light transmitting hole 111 therein, configured to accommodate at least one functional device. The display screen 110 may be a liquid crystal display screen (LCD) or an organic light-emitting diode (OLED) display screen, which is not specifically limited in this embodiment.

The display screen 110 is in a flat shape, including a bottom face 112 and a display face 113 for display. The bottom face 112 is facing away from the display face 113. The display face 113 is parallel or substantially parallel to the bottom face 112.

As illustrated in FIG. 2, the display screen 110 can be an LCD screen. The display screen 110 may include a display panel 114 and a backlight module 115. The display face 113 is on a side of the display panel 114, and the bottom face 112 is on a side of the backlight module 115 facing away from the display panel 114. The position of the non-display area A2 on the display panel 114 corresponds to the position of the light transmitting hole 111 on the backlight module 115. The center of the non-display area A2 can be on the axis of the light transmitting hole 111. It can be understood that, the non-display area A2 can be a light transmitting hole or a light transmitting plate, and so on. The display area A1 is used to display images to display text, images, icons, or videos to interact with users. The non-display area A2 is configured to form an optical signal path between the functional device and the outside.

The display assembly 100 may further include a cover glass 130. The cover glass 130 is covered on the display screen 110. The shape of the cover glass 130 is consistent with the shape of the display screen 110, and the size of the cover glass 130 may be equal to or slightly larger than the size of the display screen 110. The cover glass 130 can protect the functional device received in the light transmitting hole 111. The cover glass 130 is transparent.

In some embodiment, the light transmitting hole 111 can only penetrate through the backlight module 115 along a direction perpendicular to the bottom face 112. In alternative embodiments, the light transmitting hole 111 can also penetrate through the backlight module 115 and at least part of the display panel 114, along a direction perpendicular to the bottom face 112. Whether the light-transmitting hole 111 penetrates the display panel 114 or the penetration depth is not specifically limited herein. In some embodiment, the light transmitting hole 111 may perpendicular to the bottom face 112. In alternative embodiments, the light transmitting hole 111 may penetrate through the backlight module 115 at an oblique angle to the bottom face 112.

The light transmitting hole 111 forms an accommodating space to accommodate the functional device. It can be understood that, the shape and size of the light transmitting hole 111 are adapted to the size of the functional device. The cross-sectional shape of the light transmitting hole 111 can be circular, semicircle, rectangular rectangle, rounded rectangle, triangle, ellipse, regular polygon, irregular polygon, or other shapes.

The light transmitting hole 111 may be disposed at any position of the display screen 110. In some embodiments, in order to reduce the influence on the display area of the display screen 110, the light transmitting hole 111 may be disposed close to an edge of the display screen 110. That is, the light transmitting hole 111 can be defined close to an edge of the display screen 110, so that the influence of the light transmitting hole 111 on the display screen 110 can be further reduced.

Referring to FIG. 3, the backlight module 115 may include a base plate 1151. The bottom face 112 is on a side of the base plate 1151 facing away from the display panel 114, that is, the positioning member 120 is fixed on the side of the base plate 1151 away from the display panel 114. The backlight module 115 may further include a reflective film, a light guide plate, an anti-reflection film, a backlight, and the like. The anti-reflection film, the light guide plate, the backlight, the reflective film, and the base plate 1151 can be stacked in order from top to bottom, for example. It can be understood that, the backlight module 115 may further include more or less components than the embodiment mentioned above, which is not limited herein.

The display screen 110 may further include an inner frame 116. The inner frame 116 is disposed along an inner face of the light transmitting hole 111 to surround the functional device. The inner frame can be fixedly connected to the backlight module 115, for example, can be connected to an edge of a through hole 1152 on the base plate 1151. The through hole 1152 is communicated with the light transmitting hole 111 and is coaxial with the light transmitting hole 111. The inner frame 116 can be used as a support for the functional devices. At the same time, the inner frame 116 can also be used to support the display panel 114 and block light emitted from the backlight module 115 thereby avoiding light leakage. The inner frame 116 can be fixed to the base plate 1151 by means of bonding, can be fixed to the base plate 1151 by means of screw fastening, can be fixed to the base plate 1151 by welding, can also be fixed to the base plate 1151 by integral molding and so on. In the illustrated embodiment, the inner frame 116 and the base plate 1151 can be integrally molded by in-mold molding. As illustrated in FIG. 3, the edge of the through hole 1152 on the base plate 1151 can be bend toward the display face 113. The bending part 1153 can be embedded in the inner frame 116 to increase structural stability.

In this embodiment, the positioning member 120, the inner frame 116 and the base plate 1151 may be made of plastic material, resin material, alloy material, or metal material, etc. For example, the positioning member 120, the inner frame 116 and the base plate 1151 can all made of the metal material. The inner frame 116 made of plastic material or resin material can reduce damage to the functional device.

The positioning member 120 is positioned on the bottom face 112. That is, the positioning member 120 is disposed on the side of the bottom face 112 away from the display face 113 and is fixedly connected to the bottom face 112. In some embodiment, the positioning member 120 and the bottom face 112 can be bonded by an adhesive, for example, by dispensing adhesive or by a double-sided adhesive. In alternative embodiments, the positioning member 120 can be positioned on the bottom face 112 by means of screw fastening, by by means of welding, or by integral molding and so on.

The positioning member 120 can be located at the periphery of the light transmitting hole 111 to limit a movement of the functional device received in the light transmitting hole 111. When the functional device is mounted within the light transmitting hole 111, the positioning member 120 can limit the movement of the functional device a direction parallel to the bottom face 122. The functional device can be assembled into the light-passing hole along the axial direction of the light transmitting hole 111. The positioning member 120 may include a plurality of sub-positioning members. The plurality of sub-positioning members are disposed at the periphery of the light transmitting hole 111 and spaced apart from each other at the periphery of the light transmitting hole 111. In the alternative embodiments, the positioning member may define an annular through hole. For example, the positioning member 120 can be integrally formed in a ring shape and disposed around the light transmitting hole 111. The diameter of the annular through hole is equal to or larger than the diameter of the light transmitting hole. The inner face 120A of the positioning member 120 can be contacted with the outer face of the functional device (such as the front camera) to position the functional device.

Referring to FIG. 3, the structure of the positioning member 120 will be described below by taking the shape of the positioning member 120 as a ring. In some embodiment, the positioning member 120 may include a supporting plate 121 and a limit ring 122. The supporting plate 121 is positioned on the bottom face 112 to support the limit ring 122 and increase contact area between the limit ring 122 and the bottom face 112. The limit ring 122 extends from the supporting plate 121 toward a direction away from the display screen 110. The limit ring 122 may extend from the supporting plate 121 near the light transmitting hole 111 toward a direction away from the display screen 110. It can be understood that, the aperture of the limit ring 122 is adapted to the size of the functional device. The limit ring 122 limits the functional device in a manner surrounding the functional device, thereby improving the positioning accuracy. The supporting plate 121 can be integrally formed with the limit ring 122 to achieve a simplified structure and to reduce tolerances.

Referring to FIG. 4, in some embodiments, the limit ring 122 may extend from a middle portion of the supporting plate 121 away from the display screen 110.

Figure 5:
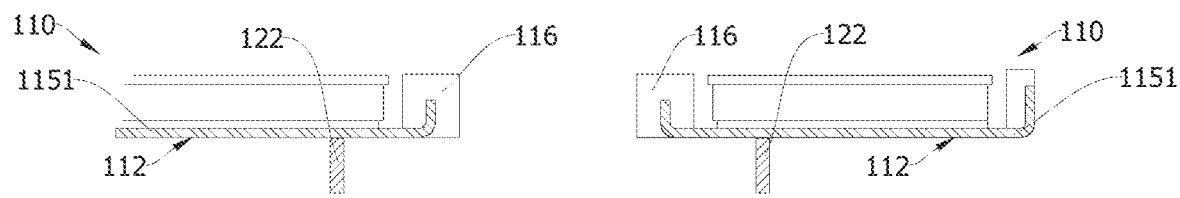
FIG. 5 is a schematic sectional view of another positioning member provided by the first embodiment of the present disclosure.

Referring to FIG. 5, in some alternative embodiments, the positioning member 120 may only include the limit ring 122, one end of the limit ring 122 is fixedly connected to the bottom face 112, and the other end of the limit ring 122 extends from the bottom face 112 away from the display screen 110.

Figure 6:
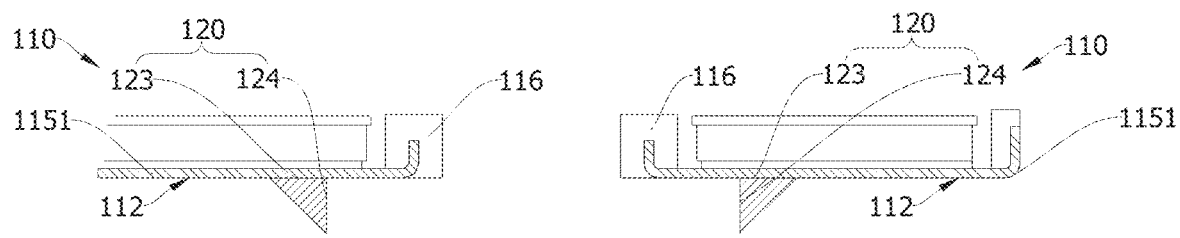
FIG. 6 is a schematic sectional view of still another positioning member provided by the first embodiment of the present disclosure.

Referring to FIG. 6, in other some alternative embodiments, the cross section of the ring defined by the positioning member 120 may be a triangle. The outer face of the positioning member 120 may include a first right-angle side 123 fixed to the bottom face 112, and a second right-angled side 124 extends from the first right-angled side 123 in a direction away from the display screen 110. The cross-sectional shape of the positioning member 120 can also be other shapes, and the specific shape does not constitute a limitation on the specific embodiment of the present disclosure.

The display screen 110 can also be an OLED screen, and the positioning member 120 can be fixed on a bottom face of the OLED screen, which is facing away from a display face of the OLED screen.

In this embodiment, the positioning member 120 is directly fixed on the bottom face 112 of the display screen 110, so that the tolerance chain is shortened. The hole of the display screen 110 is only affected by the tolerance of the camera itself, the tolerance of the positioning member 120, and the assembly tolerance of the display panel 114 and the backlight module 115. Therefore, the safety design gap between the front camera lens and the inner face of the hole can be reduced from the current 0.4 to 0.2, which greatly reduces the size of the hole, thereby reducing the width of the light transmitting hole 111 and reducing the black side of the hole.

Thus, the display assembly 100 provided in the first embodiment of the present disclosure can reduce the size of the hole opened in the display screen 110, and increase the proportion of the display area.

The Second Embodiment

Figure 7:
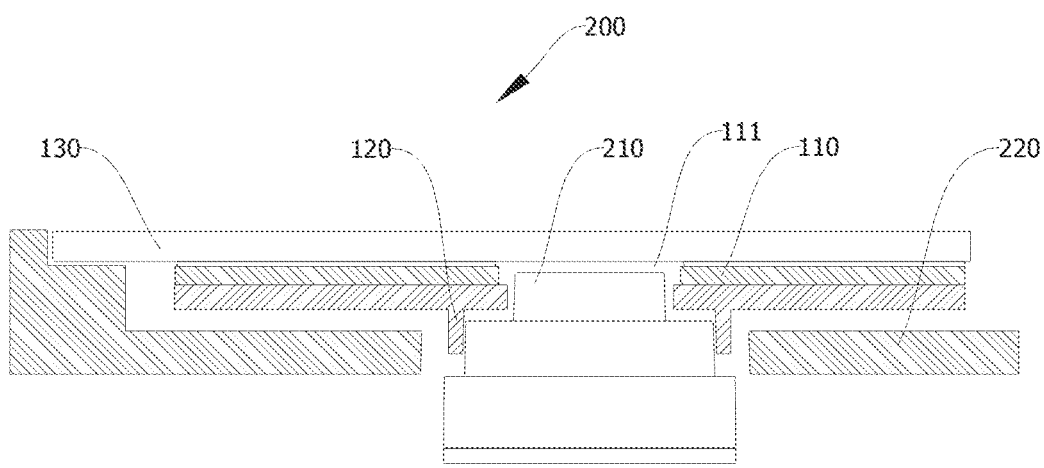
FIG. 7 is a schematic sectional view of a display assembly provided by a second embodiment of the present disclosure.

Referring to FIG. 2 and FIG. 7, the embodiment of the present disclosure provides a display assembly 200, the display assembly 200 may include the display assembly 100 provided by the first embodiment and a functional device 210. The functional device 210 is received in the light transmitting hole 111 and positioned by the positioning member 120.

In this embodiment, the display assembly 200 may further include a housing 220. The display screen 110, the positioning member 120, and part of the functional device 210 are disposed in the housing 220. The functional device 210 may include a plurality of components disposed inside the mobile terminal, such as a projection component, a camera, a proximity light sensor, an earpiece, a distance sensor, an ambient light level sensor, a temperature sensor, a pressure sensor, and the like. In some embodiments, the components received in the light transmitting hole 111, may be partially disposed in the housing 220, and partially extending out of the housing 220 from the light transmitting hole 111. In alternative embodiments, all of the components may be disposed inside the housing 220 or partially embedded in the housing 220. The functional device 210 can also include one component. For example, the functional device 210 can be a front camera. The front camera may include lenses and a lens mount for mounting the lenses. The lenses and the lens mount can be received in the light transmitting hole 111. The rim of the lens mount can be exposed to the outside of the housing 220 or located at the edge of the light transmitting hole 111. It should be noted that the relative positional relationship between the functional device 210 and the housing 220 in this embodiment is merely exemplary and is does not limit the embodiments of the disclosure.

It can be understood that, the housing 220 can be a middle frame or a rear cover. If the housing 220 is the rear cover, the display screen 110, the positioning member 120, and the functional device 210 are all disposed in the housing 220. The shape of the housing 220 is consistent with the shape of the display screen 110. The size of the housing 220 may be equal to or slightly larger than the size of the display screen 110.

The Third Embodiment

Figure 8:
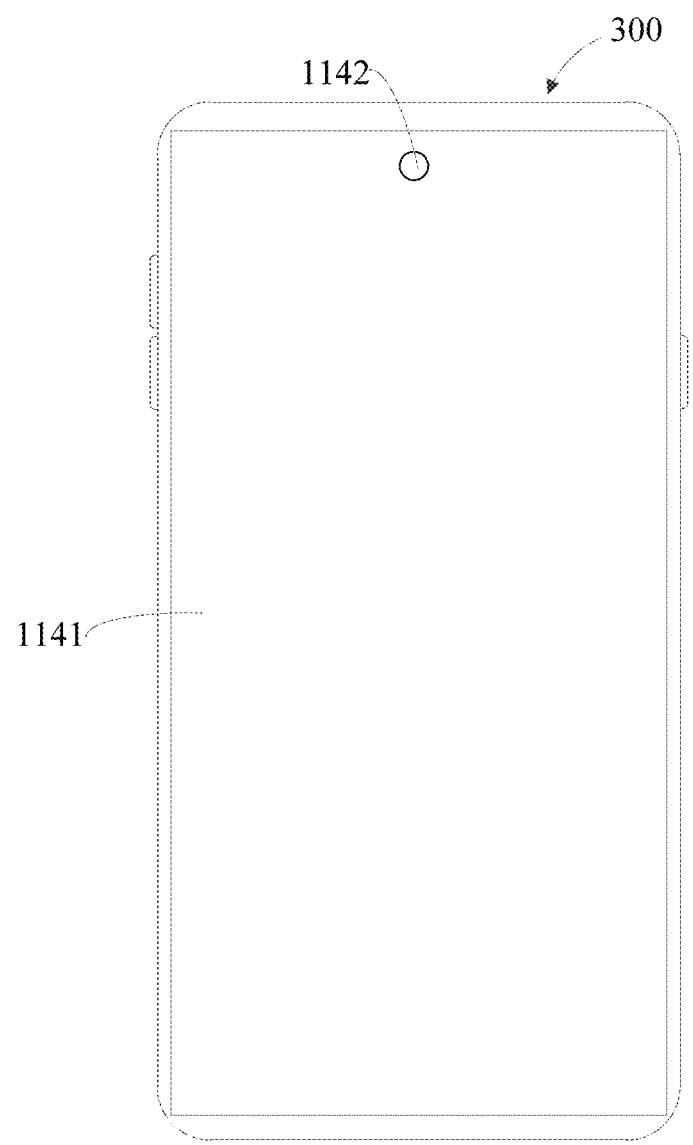
FIG. 8 is a schematic view of a mobile terminal provided by a third embodiment of the present disclosure.

Referring to FIG. 8, the third embodiment of the present disclosure provides a mobile terminal 300, the mobile terminal 300 may include the functional device and the display assembly 100, or include the display assembly 200. The functional device is received in the light transmitting hole 111 of the display assembly 100, or the light transmitting hole 111 of the display assembly 200. In addition, the area pointed by the reference numeral 1142 in the FIG. 8 can be the non-display area A2 in the FIG. 2, and the another area pointed by the reference numeral 1141 in the FIG. 8 can be the display area A1 in the FIG. 2.

In summary, the display assembly and the mobile terminal provided by embodiments of the present disclosure, may include the display screen and the positioning member, a light transmitting hole is disposed in the display screen. The display screen may include a bottom face and a display face for display, the light transmitting hole at least through the bottom face. The positioning member is positioned on the bottom face and located at a periphery of the light transmitting hole, for defining functional device received in the light transmitting hole. By fixing the positioning member to the bottom face and located around the light transmitting hole, used to define functional device received in a light transmitting hole, to reduce the size of the hole of the display screen and increase the proportion of the display area.

Figure 9:
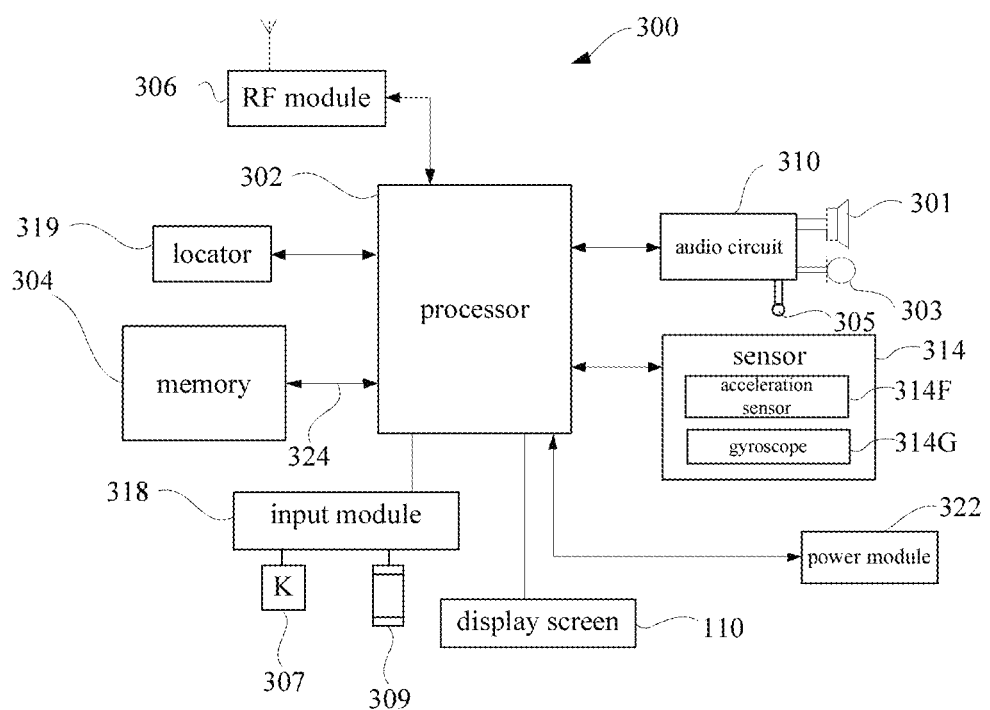
FIG. 9 is a structural block diagram of a mobile terminal provided by the third embodiment of the present disclosure.

Referring to FIG. 9, the mobile terminal 300 according to the embodiment mentioned above may include one or more (only one shown in the figure) processors 302, a memory 304, an RF (radio frequency) module 306, an audio circuit 310, a sensor 314, an input module 318, and a power module 322. It will be understood by those of ordinary skill in the art that the structure shown in FIG. 9 is merely illustrative and does not limit the structure of the mobile terminal 300. For example, the mobile terminal 300 may also include more or less components than those illustrated in FIG. 9, or have a different configuration than that illustrated in FIG. 9.

One of ordinary skill in the art will appreciate that all other components are peripherals relative to processor 302, and the processor 302 is coupled to the peripherals via a plurality of peripheral interfaces 324. The peripheral interface 324 can be implemented based on, but not limited to the following standards: universal asynchronous receiver/transmitter (UART), general purpose input output (GPIO), serial peripheral interface (SPI), inter-integrated Circuit (I2C). In some examples, the peripheral interface 324 may only include a bus, and in other examples, the peripheral interface 324 may also include other components, such as one or more controllers, such as a display controller for connecting the display screen 110 or a memory controller for connecting to the memory. In addition, these controllers can also be detached from the peripheral interface 324 and integrated into the processor 302 or within a corresponding peripheral.

The memory 304 can be configured to store software programs and modules, and the processor 302 executes various functional applications and data processing by running software programs and modules stored in the memory 304. The memory 304 may include high speed random access memory and may also include non-volatile memory such as one or more magnetic storage devices, flash memory, or other non-volatile solid state memory. In some embodiments, memory 304 may further include memory remotely configured relative to processor 302, which may be connected to mobile terminal 300 or display screen 110 via a network. Such networks include, but are not limited to, the Internet, intranets, local area networks, mobile communication networks, and combinations thereof.

The RF module 306 is configured to receive and transmit electromagnetic waves, and convert electromagnetic waves and electrical signals to communicate with a communication network or other device. The RF module 306 can include various existing circuit components for performing these functions, such as an antenna, a radio frequency transceiver, a digital signal processor, an encryption/decryption chip, a subscriber identity module (SIM) card, a memory, and the like. The RF module 306 can communicate with various networks such as the Internet, an intranet, a wireless network, or communicate with other devices over a wireless network. The wireless network described above may include a cellular telephone network, a wireless local area network, or a metropolitan area network. The above wireless network can use various communication standards, protocols and technologies, including but not limited to global system for mobile communication (GSM), enhanced data GSM environment (EDGE), wideband code division multiple access (W-CDMA), code division access (CDMA), time division multiple access (TDMA), wireless fidelity (WiFi) (such as the institute of electrical and electronics engineers standards IEEE 802.10A, IEEE 802.11b, IEEE 802.11g and/or IEEE 802.11n), voice over internet protocol (VoIP), worldwide interoperability for microwave access, (Wi-Max), other protocols for mail, instant messaging and short messages, and any other suitable communication protocols, even those that are not currently being developed.

The audio circuit 310, the speaker 301, the sound jack 303, and the microphone 305 together provide an audio interface between the user and the mobile terminal 300. Specifically, the audio circuit 310 receives sound data from the processor 302, converts the sound data into an electrical signal, and transmits the electrical signal to the speaker 301. The speaker 301 converts the electrical signal into a sound wave that can be heard by the human ear. The audio circuit 310 also receives electrical signals from the microphone 305, converts the electrical signals into sound data, and transmits the sound data to the processor 302 for further processing. Audio data may be obtained from memory 304 or through RF module 306. Additionally, audio data may also be stored in memory 304 or transmitted by RF module 306.

The sensors 314 are disposed within the mobile terminal 300 or within the display screen 110, examples of which include, but are not limited to, acceleration sensor 314F, gyroscope 314G, magnetometer and other sensors.

Specifically, the gyroscope 314G can detect the posture of the mobile terminal 300, thereby determining the orientation of each component, determining the orientation of the display screen 110, determining the orientation of the screen, and the like. The acceleration sensor 314F can detect the magnitude of acceleration in each direction (typically three axes), the magnitude and direction of gravity can be detected at rest, and can be configured to identify the application of the mobile terminal 100 (such as horizontal and vertical screen switching, related games, magnetometer attitude calibration), vibration recognition related functions (such as pedometer, tapping) and the like. In addition, the electronic body 10 can also be equipped with other sensors such as gyroscopes, barometers, hygrometers, thermometers, etc., and will not repeat them here.

In this embodiment, the input module 318 may include a touch display screen 309 disposed on the display screen 110, and the touch display screen 309 may collect the user's touch operation thereon or near (for example, the user operates on the touch display screen 309 or near the touch display screen 309 using any suitable object or accessory such as a finger or a stylus.), and drive the corresponding connecting device according to a preset program. Alternatively, the touch display screen 309 may include a touch detection device and a touch controller. Wherein, the touch detection device detects the touch orientation of the user, detects a signal brought by the touch operation, and transmits the signal to the touch controller; the touch controller receives touch information from the touch detection device, converts the touch information into contact coordinates, sends it to the processor 302, and can receive and execute commands from the processor 302. In addition, the touch detection function of the touch display screen 309 can be realized by various types such as resistive, capacitive, infrared, and surface acoustic waves. In addition to touch display screen 309, in other variant embodiments, input module 318 may also include other input devices, such as button 307. The button 307 may include, for example, a character button for inputting a character, and a control button for triggering a control function. Examples of control buttons include a "return to home screen" button, a power on/off button, and the like.

The display screen 110 is used to display information input by the user, information provided to the user, and various graphical user interfaces of the mobile terminal 300, and these graphical user interfaces may be composed of graphics, text, icons, numbers, videos, and any combination thereof. In one example, the touch display screen 309 can be disposed on the display screen 110 to form an integral with the display screen 110, among them, each display area of display screen 110 can be set with a touch screen.

The power module 322 is used to provide power to the processor 302 and other components. Specifically, the power module 322 may include a power management system, one or more power sources (such as a battery or an alternating current), a charging circuit, a power failure detecting circuit, an inverter, a power status indicator, and any other components related to the generation, management, and distribution of power within the mobile terminal 300.

The mobile terminal 300 also includes a locator 319 for determining the actual location at which the mobile terminal 300 is located. In this embodiment, the locator 319 uses a positioning service to implement positioning of the mobile terminal 300, and the location service should be understood as a technique or service for obtaining the location information of the mobile terminal 300 through a specific positioning technology and marking the location of the located object on the electronic map.

In the description of the present specification, the description with reference to the terms "one embodiment", "some embodiments", "example", "specific example", or "some examples" and the like means that the specific features, structures, materials or characteristics described in connection with the embodiments or examples are included in at least one embodiment or example of the present disclosure. In the present specification, the schematic representation of the above terms is not necessarily directed to the same embodiment or example. Furthermore, the particular features, structures, materials, or characteristics described may be combined in a suitable manner in any one or more embodiments or examples. In addition, those skilled in the art can combine the different embodiments or examples described in the specification and the features of the different embodiments or examples without contradicting each other.

Finally, it should be noted that the above embodiments are only used to illustrate the technical solutions of the present disclosure, and are not limited thereto; although the present disclosure has been described in detail with reference to the foregoing embodiments, those of ordinary skill in the art should understand that it can still modify the technical solutions described in the foregoing embodiments, or replace some of the technical features, and the modifications and substitutions do not drive the essence of the corresponding technical solutions from the spirit and scope of the technical solutions of the embodiments of the present disclosure.

What is claimed is:

1. A display assembly, comprising:
a display screen, comprising a display panel, a backlight module and an inner frame, the display panel comprising a display face, the backlight module comprising a base plate, the base plate comprising a bottom face facing away from the display panel, the display screen defining a light transmitting hole in the display screen and at least penetrating through the bottom face, wherein the inner frame is disposed along an inner face of the light transmitting hole to surround a functional device received in the light transmitting hole, the base plate defines a through hole communicated with the light transmitting hole, the base plate comprises a bending part embedded in the inner frame; and
a positioning member, being positioned on the bottom face and located at a periphery of the light transmitting hole, wherein the positioning member is configured to limit a movement of the functional device received in the light transmitting hole in a direction parallel to the bottom face.

2. The display assembly as claimed in claim 1, wherein the through hole is coaxial with the light transmitting hole, and the bending part is toward the display surface.

3. The display assembly as claimed in claim 2, wherein the inner frame and the base plate are integrally molded by in-mold molding.

4. The display assembly as claimed in claim 1, wherein the display panel comprises a display area and a non-display area, a position of the non-display area on the display panel corresponds to a position of the light transmitting hole on the backlight module, the display area is configured to display images, and the non-display area is configured to form an optical signal path between the functional device and the outside.

5. The display assembly as claimed in claim 1, wherein the positioning member comprises a supporting plate and a limit ring extending from the supporting plate toward a direction away from the display screen, and the supporting plate is fixed to the bottom face.

6. The display assembly as claimed in claim 5, wherein the limit ring extends from a middle portion of the supporting plate away from the display screen.

7. The display assembly as claimed in claim 5, wherein the limit ring extends from an end of the supporting plate adjacent to light transmitting hole.

8. The display assembly as claimed in claim 1, wherein the positioning member defines an annular through hole, and the diameter of the annular through hole is equal to or larger than the diameter of the light transmitting hole.

9. The display assembly as claimed in claim 8, wherein a cross-sectional shape of the positioning member is a rectangle or a triangle.

10. The display assembly as claimed in claim 1, wherein the positioning member comprises a plurality of sub-positioning members, and the plurality of sub-positioning members are spaced apart from each other.

11. The display assembly as claimed in claim 1, wherein the positioning member and the bottom face are made of metal material, and the positioning member is welded to the bottom face.

12. The display assembly as claimed in claim 1, wherein an axis of the light transmitting hole is perpendicular to the bottom face.

13. The display assembly as claimed in claim 1, wherein the light transmitting hole is disposed at a position close to an edge of the display screen.

14. The display assembly as claimed in claim 1, wherein the display screen is an OLED screen.

15. A display assembly, comprising:
a display screen, comprising a display panel, a backlight module and an inner frame, the display panel comprising a display face, the backlight module comprising a bottom face, the display screen defining a light transmitting hole in the display screen and at least penetrating through the bottom face, the inner frame being disposed along an inner face of the light transmitting hole;
a positioning member, comprising a limit ring located at a periphery of the light transmitting hole, wherein one end of the limit ring is fixedly connected to the bottom face and the other end of the limit ring extends from the bottom face away from the display screen; and
a functional device being received in the light transmitting hole, surrounded by the inner frame and positioned by the limit ring of the positioning member.

16. The display assembly as claimed in claim 15, wherein the functional device comprises at least one of a projection component, a camera, a proximity light sensor, an earpiece, a distance sensor, an ambient light level sensor, a temperature sensor, and a pressure sensor.

17. The display assembly as claimed in claim 15, wherein the functional device comprises a front camera, the front camera faces outside through the light transmitting hole.

18. A mobile terminal, comprising:
a display screen, comprising a display panel, a backlight module and an inner frame, the display panel comprising a display face, the backlight module comprising a base plate, the base plate comprising a bottom face facing away from the display panel, the display screen defining a light transmitting hole in the display screen and at least penetrating through the bottom face;

a positioning member, being positioned on the bottom face and located at a periphery of the light transmitting hole;

a functional device being installed in the light transmitting hole of the display screen and positioned by the positioning member; and a housing, wherein the display screen, the positioning member, and the functional device are disposed in the housing;

wherein the inner frame is disposed along an inner face of the light transmitting hole to surround the functional device, the base plate comprising a bending part embedded in the inner frame.

19. The mobile terminal as claimed in claim 18, wherein the positioning member comprises a limit ring, one end of the limit ring is fixedly connected to the bottom face, and the other end of the limit ring extends from the bottom face away from the display screen.

20. The mobile terminal as claimed in claim 18, wherein the positioning member comprises a supporting plate and a limit ring extending from the supporting plate toward a direction away from the display screen, and the supporting plate is fixed to the bottom face.

* * * * *